(12) United States Patent
Soyano (10) Patent No.: US 9,299,633 B2
(45) Date of Patent: Mar. 29, 2016

(54) SEMICONDUCTOR DEVICE, HEAT RADIATION MEMBER, AND MANUFACTURING METHOD FOR SEMICONDUCTOR DEVICE

(75) Inventor: Shin Soyano, Shiojiri (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 314 days.

(21) Appl. No.: 13/814,852

(22) PCT Filed: Aug. 30, 2011

(86) PCT No.: PCT/JP2011/069562
§ 371 (c)(1),
(2), (4) Date: Mar. 4, 2013

(87) PCT Pub. No.: WO2012/056809
PCT Pub. Date: May 3, 2012

(65) Prior Publication Data
US 2013/0200510 A1   Aug. 8, 2013

(30) Foreign Application Priority Data

Oct. 26, 2010   (JP) .................................. 2010-239269

(51) Int. Cl.
| | |
|---|---|
| H01L 23/15 | (2006.01) |
| H01L 23/10 | (2006.01) |
| H01L 23/34 | (2006.01) |
| H01L 23/367 | (2006.01) |
| H01L 23/373 | (2006.01) |
| H01L 23/00 | (2006.01) |
| H01L 21/50 | (2006.01) |
| H01L 25/07 | (2006.01) |

(52) U.S. Cl.
CPC ................ *H01L 23/34* (2013.01); *H01L 21/50* (2013.01); *H01L 23/3677* (2013.01); *H01L 23/3735* (2013.01); *H01L 23/562* (2013.01); *H01L 25/072* (2013.01); *H01L 2224/32225* (2013.01); *H01L 2224/48091* (2013.01); *H01L 2224/48137* (2013.01); *H01L 2224/48227* (2013.01); *H01L 2224/49111* (2013.01); *H01L 2224/73265* (2013.01); *H01L 2924/1305* (2013.01); *H01L 2924/13055* (2013.01)

(58) Field of Classification Search
USPC .......................................... 257/712; 165/185
See application file for complete search history.

(56) References Cited

U.S. PATENT DOCUMENTS

| | | | |
|---|---|---|---|
| 2010/0193941 A1 | 8/2010 | Mori et al. | |
| 2012/0139096 A1* | 6/2012 | Gohara | H01L 23/3735 257/706 |

FOREIGN PATENT DOCUMENTS

| | | | | |
|---|---|---|---|---|
| JP | 2004-022914 | * | 1/2004 | ............. H01L 23/36 |
| JP | 2004-022914 A | | 1/2004 | |
| JP | 2009-026957 A | | 2/2009 | |
| JP | 2010-182831 A | | 8/2010 | |
| JP | 2010-238963 A | | 10/2010 | |

OTHER PUBLICATIONS

PCT, "International Search Report for PCT/JP2011/069562", Nov. 29, 2011.

* cited by examiner

*Primary Examiner* — Marc Armand
*Assistant Examiner* — Wilner Jean Baptiste
(74) *Attorney, Agent, or Firm* — Manabu Kanesaka (57) ABSTRACT

A semiconductor device has a substrate having a front surface, and a rear surface including a fin forming region and a peripheral region surrounding the fin forming region. An insulating substrate is disposed on the front surface of the substrate. A semiconductor chip is disposed on the insulating substrate. A plurality of fins is formed in the fin forming region, and a reinforcing member is formed on the substrate through a bonding member, so as to overlap the peripheral region.

20 Claims, 11 Drawing Sheets

SEMICONDUCTOR DEVICE, HEAT RADIATION MEMBER, AND MANUFACTURING METHOD FOR SEMICONDUCTOR DEVICE

TECHNICAL FIELD

The present invention relates to a semiconductor device including heat radiating fins, a heat radiation member, and a method of manufacturing a semiconductor device.

BACKGROUND ART

As a semiconductor device including heat radiating fins, a semiconductor device has been proposed which includes a substrate, an insulating substrate that is provided on the front surface of the substrate, a semiconductor chip that is provided on the insulating substrate, and a plurality of fins formed on the rear surface of the substrate.

In the semiconductor device, heat generated from the semiconductor chip is transferred to the plurality of fins through the insulating substrate and the substrate, and is then emitted from the plurality of fins to the outside. As the semiconductor device including the heat radiating fins, for example, a semiconductor device has been proposed which includes an electronic component mounting conductive layer that is formed on the upper surface of a ceramic insulating substrate, a fin base that is formed on the lower surface of the insulating substrate, and an insulating fin including a plurality of heat radiating fins (for example, see Patent Document 1).

CITATION LIST

Patent Document

Patent Publication Application 1: JP 2009-26957 A

DISCLOSURE OF THE INVENTION

Problem to be Solved by the Invention

However, in the semiconductor device having a substrate formed with a plurality of fins, a portion close to the center of the substrate formed with the plurality of fins has a different degree of thermal contraction or thermal expansion than that of a peripheral portion of the substrate in which no fin is formed. Therefore, the substrate is likely to warp.

In order to solve the problem, increasing the thickness of the substrate is considered to improve the strength of the substrate against warping. However, in this case, the thermal resistance of the substrate increases and it is difficult to effectively transfer heat generated from a semiconductor chip to a plurality of fins. As a result, the radiation performance is likely to be reduced.

The invention has been made in view of the above-mentioned problems and an object of the invention is to provide a semiconductor device, a heat radiation member, and a method of manufacturing a semiconductor device capable of preventing the warping of a substrate while improving the radiation performance.

Means for Solving Problem

In order to achieve the object, the following semiconductor device is provided. The semiconductor device includes a substrate that includes a front surface and a rear surface including a fin forming region and a peripheral region which surrounds the fin forming region. An insulating substrate is provided on the front surface. A semiconductor chip is provided on the insulating substrate. A plurality of fins is formed in the fin forming region. A reinforcing member is formed on the substrate through a bonding member, so as to overlap the peripheral region.

Effect of the Invention

According to the semiconductor device, the heat radiation member, and the method of manufacturing the semiconductor device of the invention, it is possible to prevent the warping of the substrate while improving the radiation performance. The above and other objects, features, and advantages of the invention will become apparent from the following description read in conjunction with the accompanying drawings illustrating exemplary embodiments of the invention.

BEST MODE FOR CARRYING OUT THE INVENTION

Hereinafter, embodiments will be described with reference to the accompanying drawings.

First Embodiment

Figure 1:
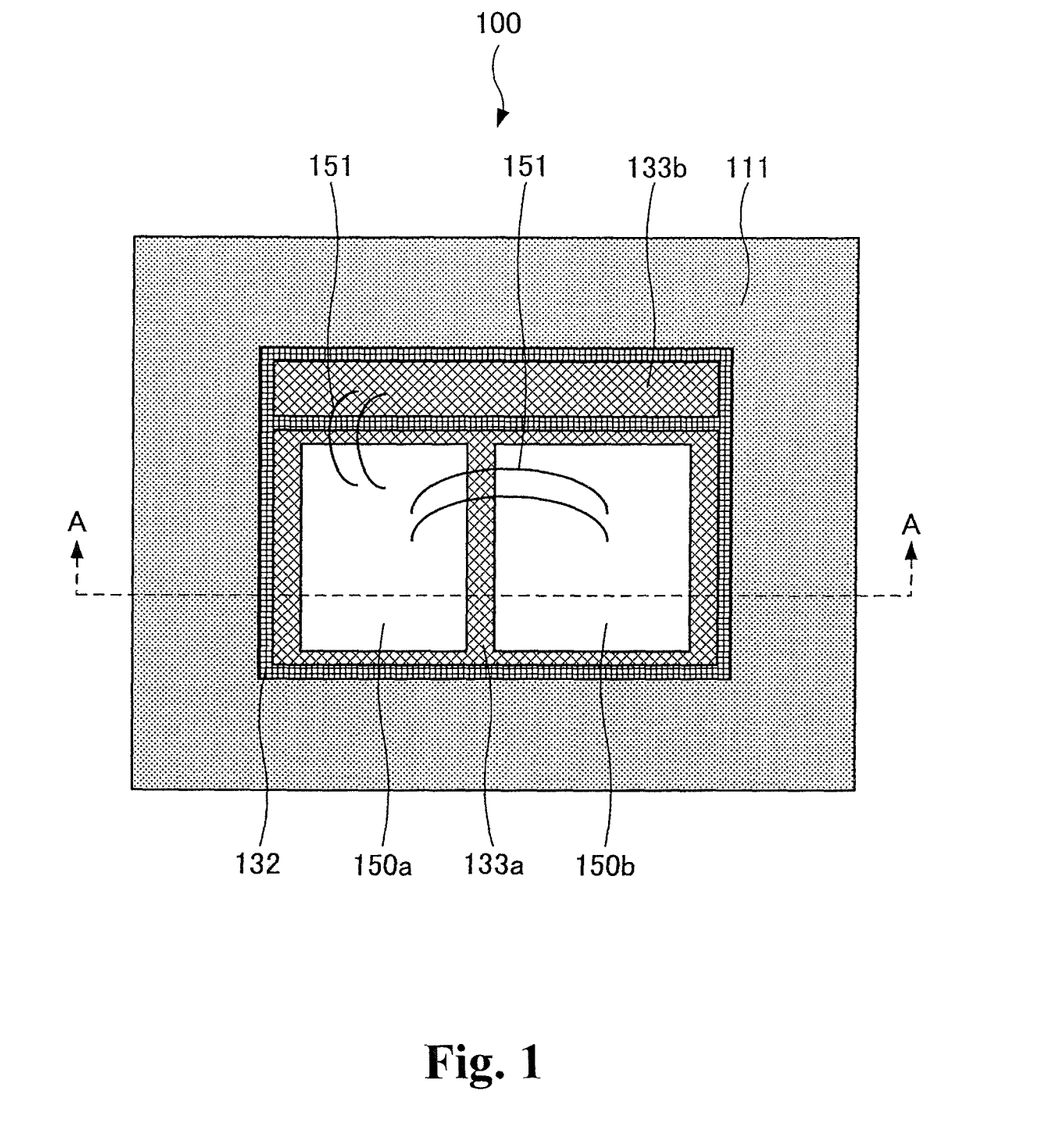
FIG. 1 is a plan view illustrating an example of a semiconductor device according to a first embodiment.
Figure 2:
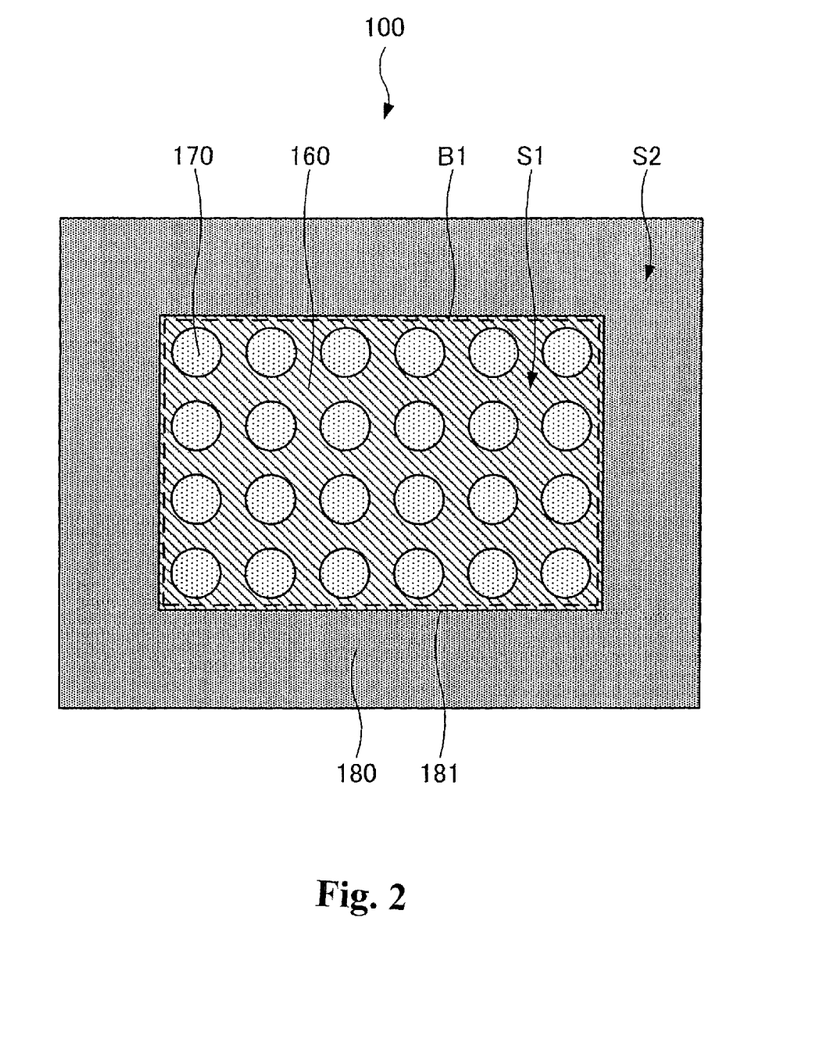
FIG. 2 is a bottom view illustrating an example of the semiconductor device according to the first embodiment.
Figure 3:
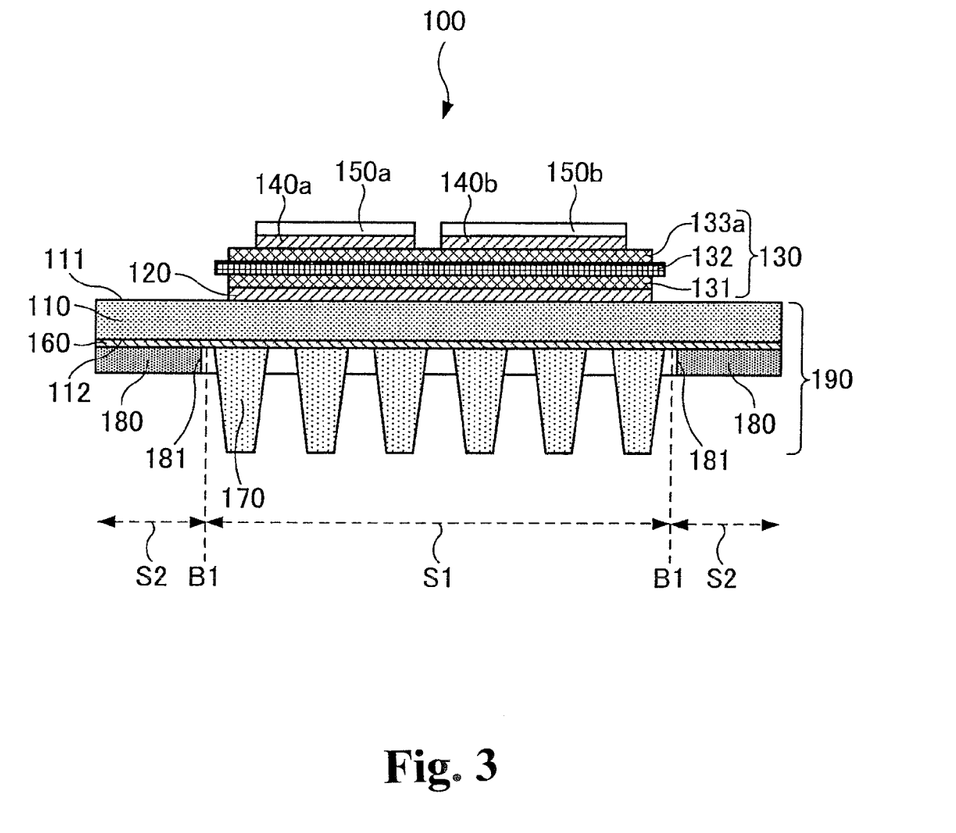
FIG. 3 is a cross-sectional view illustrating an example of the semiconductor device according to the first embodiment.

FIG. 1 is a plan view illustrating an example of a semiconductor device according to a first embodiment. FIG. 2 is a bottom view illustrating an example of the semiconductor device according to the first embodiment. FIG. 3 is a cross-sectional view illustrating an example of the semiconductor device according to the first embodiment. FIG. 3 corresponds to a cross-sectional view taken along the dotted line A-A of FIG. 1.

As illustrated in FIG. 3, a semiconductor device 100 includes a substrate 110 including a front surface 111 and a rear surface 112. The substrate 110 is made of, for example, a copper alloy or an aluminum alloy. For example, a copper alloy (copper: 99.5% or more) obtained by adding a very small amount of cobalt, phosphorous, tin, nickel, or zinc to copper is used as the copper alloy. According to a JIS standard, for example, C1020 (1000 series to 7000 series copper alloys) is used as the copper alloy. For example, an A3000 series aluminum alloy, an A5000 series aluminum alloy, an A6000 series aluminum alloy, or an A7000 series aluminum alloy is used as the aluminum alloy.

An insulating substrate 130 is provided on the front surface 111 of the substrate 110 with a bonding member 120 interposed therebetween. For example, solder is used as the material forming the bonding member 120. The insulating substrate 130 includes a conductor layer 131 that is bonded to the bonding member 120, an insulating layer 132 that is formed on the conductor layer 131, and conductor layers 133a and 133b (not illustrated in FIG. 3) that are formed on the insulating layer 132. The conductor layers 131, 133a, and 133b are made of, for example, copper or aluminum. The insulating layer 132 is made of ceramics, such as aluminum nitride, silicon nitride, or aluminum oxide.

In addition, semiconductor chips 150a and 150b are provided on the conductor layer 133a of the insulating substrate 130, with bonding members 140a and 140b interposed therebetween, respectively. As illustrated in FIG. 1, the semiconductor chips 150a and 150b are connected to each other by wires 151 or the semiconductor chips 150a and 150b and the conductor layer 133b are connected to each other by the wires 151.

For example, solder is used as the material forming the bonding members 140a and 140b. For example, insulated gate bipolar transistors (IGBTs) or free wheeling diodes (FWDs) are used as the semiconductor chips 150a and 150b.

As illustrated in FIGS. 2 and 3, the rear surface 112 of the substrate 110 includes a fin forming region S1 that is surrounded by a dotted line B1 and a peripheral region S2 that surrounds the fin forming region S1. The fin forming region S1 is disposed immediately below the insulating substrate 130. A plurality of fins 170 is formed on the fin forming region S1 with a bonding member 160 interposed therebetween.

The plurality of fins 170 is arranged in a matrix. Heat generated from the semiconductor chips 150a and 150b is transferred to the plurality of fins 170 through the insulating substrate 130 and the substrate 110 and is then emitted from the plurality of fins 170 to the outside.

For example, the bonding member 160 is made of brazing filter metal, such as a copper alloy or an aluminum alloy. For example, a phosphorous copper-based material is used as the copper alloy. For example, an A4000 series aluminum alloy is used as the aluminum alloy.

The fin 170 is made of, for example, a copper alloy or an aluminum alloy. For example, oxygen-free copper, such as C1020 (1000 series copper alloy), is used as the copper alloy. For example, an A4000 series aluminum alloy is used as the aluminum alloy.

In addition, a reinforcing member 180 is formed on the peripheral region S2 of the rear surface 112 of the substrate 110 with the bonding member 160 interposed therebetween. An opening 181 is provided in the reinforcing member 180. That is, the reinforcing member 180 has a frame shape. The reinforcing member 180 is formed on the peripheral region S2 such that the fin forming region S1 is exposed through the opening 181.

The reinforcing member 180 is made of, for example, a copper alloy or an aluminum alloy. For example, a copper alloy (copper: 99.5% or more) obtained by adding a very small amount of cobalt, phosphorous, tin, nickel, or zinc to copper is used as the copper alloy. According to the JIS standard, for example, C1000 series to C7000 series copper alloys are used as the copper alloy. For example, an A3000 series aluminum alloy, an A5000 series aluminum alloy, an A6000 series aluminum alloy, or an A7000 series aluminum alloy is used as the aluminum alloy.

In this embodiment, the reinforcing member 180 is made of a different material from the substrate 110. Specifically, the reinforcing member 180 is made of a harder material than the substrate 110. The substrate 110 is made of a material with a higher thermal conductivity than that forming the reinforcing member 180.

That is, when the reinforcing member 180 and the substrate 110 are made of, for example, a copper alloy, the reinforcing member 180 is made of, for example, a hard copper alloy selected from C1000 series to C7000 series copper alloys and the substrate 110 is made of, for example, a copper alloy with high thermal conductivity selected from the C1000 series to C7000 series copper alloys.

Figure 4:
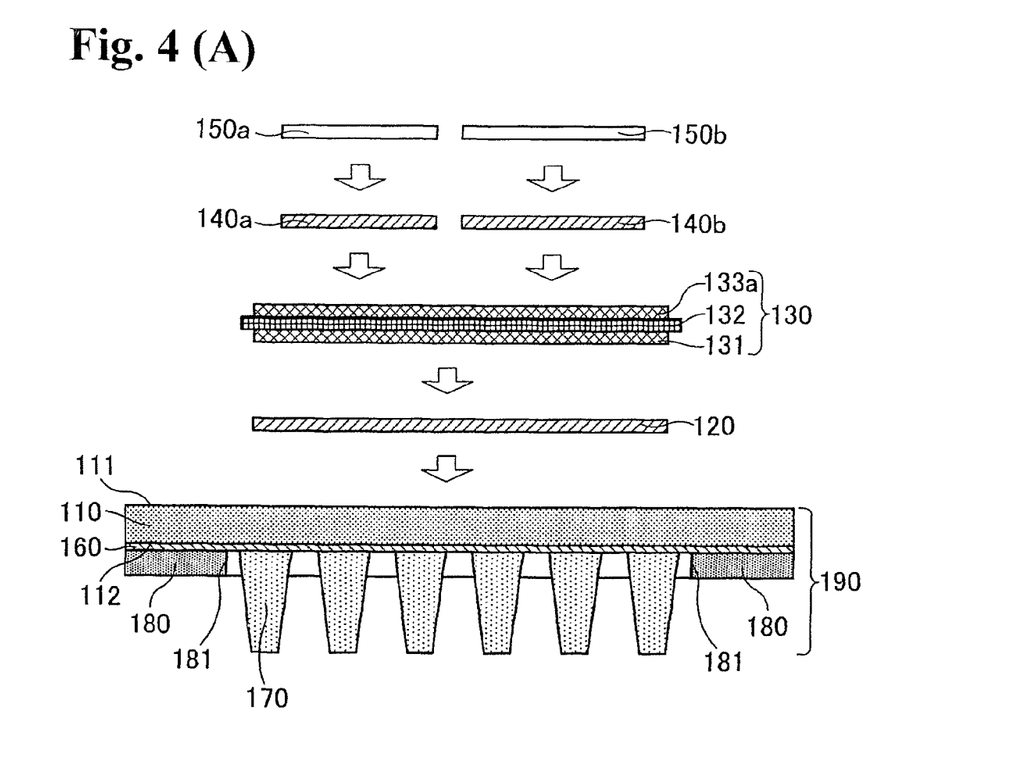
FIGS. 4A, 4B are diagrams illustrating an example of a method of manufacturing the semiconductor device according to the first embodiment.

In the semiconductor device 100, a portion including the substrate 110, the bonding member 160, the plurality of fins 170 and, the reinforcing member 180 is referred to as a heat radiation member 190. Next, a method of manufacturing the semiconductor device 100 will be described. FIGS. 4(A), 4(B) are diagrams illustrating an example of the method of manufacturing the semiconductor device according to the first embodiment.

First, as illustrated in FIG. 4(A), the heat radiation member 190 is prepared. The heat radiation member 190 is formed by mounting the plurality of fins 170 and the reinforcing member 180 on the rear surface 112 of the substrate 110 with the bonding member 160 interposed therebetween and performing a heat treatment in this state such that the plurality of fins 170 and the reinforcing member 180 are bonded to the substrate 110 by the bonding member 160. That is, the plurality of fins 170 and the reinforcing member 180 are collectively bonded to the substrate 110. In addition, a portion of or the entire surface of the heat radiation member 190 may be plated with nickel.

Then, the bonding member 120, the insulating substrate 130, the bonding members 140a and 140b, and the semiconductor chips 150a and 150b are sequentially formed on the heat radiation member 190.

Then, as illustrated in FIG. 4(B), a heat treatment is performed on a structure 101 having each component provided therein. Then, the substrate 110 and the insulating substrate 130 are bonded to each other by the bonding member 120 and the insulating substrate 130 and the semiconductor chips 150a and 150b are bonded to each other by the bonding members 140a and 140b. In this way, the semiconductor device 100 is manufactured.

As described above, in the semiconductor device 100, the reinforcing member 180 is formed on the peripheral region S2 of the rear surface 112 of the substrate 110 with the bonding member 160 interposed therebetween. According to this structure, since the periphery of the substrate 110 is supported by the reinforcing member 180, it is possible to prevent the warping of the substrate 110.

In this way, it is possible to set strength against the warping of the substrate to a small value and thus reduce the thickness of the substrate 110. When the thickness of the substrate 110 is reduced, it is possible to reduce the thermal resistance of the substrate 110 and effectively transfer heat generated from the semiconductor chips 150a and 150b to the plurality of fins 170. Therefore, it is possible to improve the radiation performance.

When the thickness of the substrate 110 is reduced, it is possible to reduce the amount of material forming the substrate 110 and use a roll material that is relatively easy to acquire. Therefore, it is possible to reduce material costs. In addition, it is possible to reduce the weight of the semiconductor device 100. In particular, when the semiconductor device 100 is used in an in-vehicle component, it is very effective in reducing the weight of the vehicle since there is a strong demand for lightweight vehicles.

In the semiconductor device 100, the reinforcing member 180 is formed on the rear surface 112 of the substrate 110 with the bonding member 160 interposed therebetween. That is, the reinforcing member 180 is provided separately from the substrate 110.

Therefore, even when the degree of the warping of the substrate 110 varies depending on, for example, the purpose of the semiconductor device 100, for example, it is possible to respond to the variation in the degree of the warping by adjusting the thickness of the reinforcing member 180, without changing the thickness of the substrate 110. That is, it is not necessary to prepare different types of substrates 110 according to the degree of the warping of the substrate 110, which makes it possible to reduce manufacturing costs.

In the semiconductor device 100, the reinforcing member 180 is made of a different material from the substrate 110. Specifically, the reinforcing member 180 is made of a harder material than the substrate 110. In this way, it is possible to strongly support the periphery of the substrate 110. In addition, the substrate 110 is made of a material with a higher thermal conductivity than that forming the reinforcing member 180. Therefore, it is possible to effectively transfer heat generated from the semiconductor chips 150a and 150b to the plurality of fins 170.

In the semiconductor device 100, the fins 170 and the reinforcing member 180 are bonded to the substrate 110 by the bonding member 160. Since the fins 170 and the reinforcing member 180 are bonded together, it is possible to assemble the semiconductor device without warping the substrate 110, which makes it easy to manufacture the semiconductor device.

(Modification)

Figure 5:
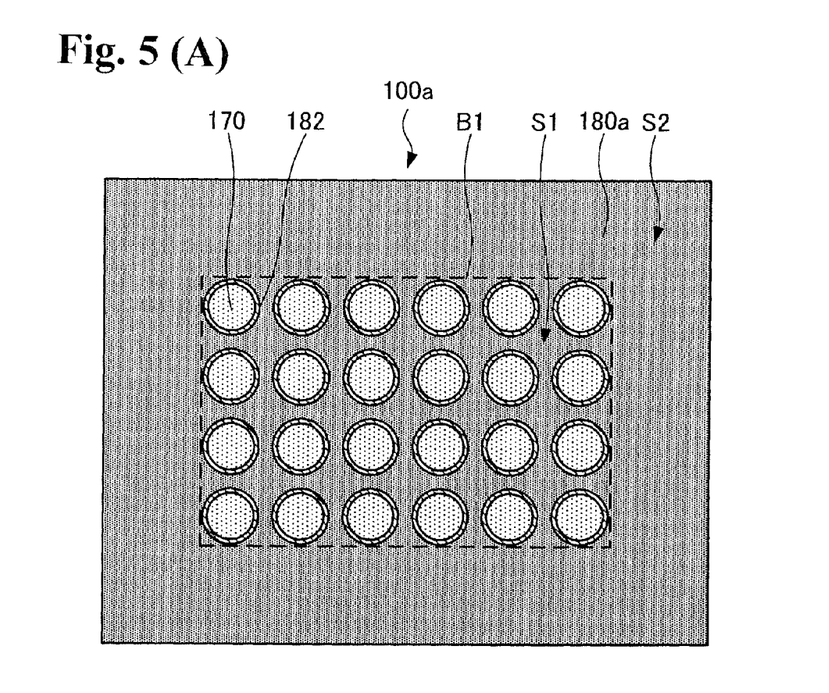
FIGS. 5A, 5B are diagrams illustrating a semiconductor device according to a modification of the first embodiment.

Next, a modification of the semiconductor device 100 will be described. FIGS. 5(A), 5(B) are diagrams illustrating a semiconductor device according to a modification of the first embodiment. FIG. 5(A) is a bottom view illustrating the semiconductor device and FIG. 5(B) is a cross-sectional view illustrating the semiconductor device.

A semiconductor device 100a according to the modification differs from the semiconductor device 100 in that, instead of the reinforcing member 180, a reinforcing member 180a having a shape and arrangement different from those of the reinforcing member 180 is used. The other structures are the same as those of the semiconductor device 100.

As illustrated in FIGS. 5(A) and 5(B), the reinforcing member 180a includes a plurality of through holes 182. The diameter of the through hole 182 is more than that of the fin 170. The reinforcing member 180a is formed on the peripheral region S2 and the fin forming region S1 of the rear surface 112 of the substrate 110, with the bonding member 160 interposed therebetween, such that the plurality of fins 170 is disposed in the plurality of through holes 182.

In the semiconductor device 100a, a portion including the substrate 110, the bonding member 160, the plurality of fins 170, and the reinforcing member 180a is referred to as a heat radiation member 190a.

In the semiconductor device 100a, the reinforcing member 180a is formed on the peripheral region S2 of the rear surface 112 of the substrate 110 with the bonding member 160 interposed therebetween. According to this structure, since the periphery of the substrate 110 is supported by the reinforcing member 180a, it is possible to prevent the warping of the substrate 110. Therefore, it is possible to reduce the thickness of the substrate 110 and improve the radiation performance.

A method of manufacturing the semiconductor device 100a is the same as the method of manufacturing the semiconductor device 100 illustrated in FIGS. 4(A), 4(B). That is, the semiconductor device 100a is manufactured by sequentially mounting the bonding member 120, the insulating substrate 130, the bonding members 140a and 140b, and the semiconductor chips 150a and 150b on the heat radiation member 190a and performing a heat treatment on a structure having each component provided therein.

Figure 6A:
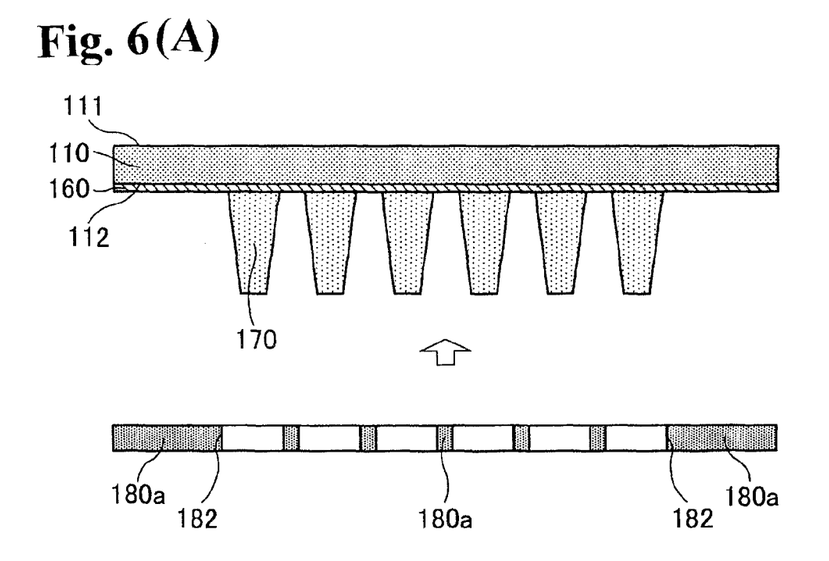
FIGS. 6A, 6B are diagrams illustrating a method of manufacturing a heat radiation member according to a modification of the first embodiment.
Figure 6B:
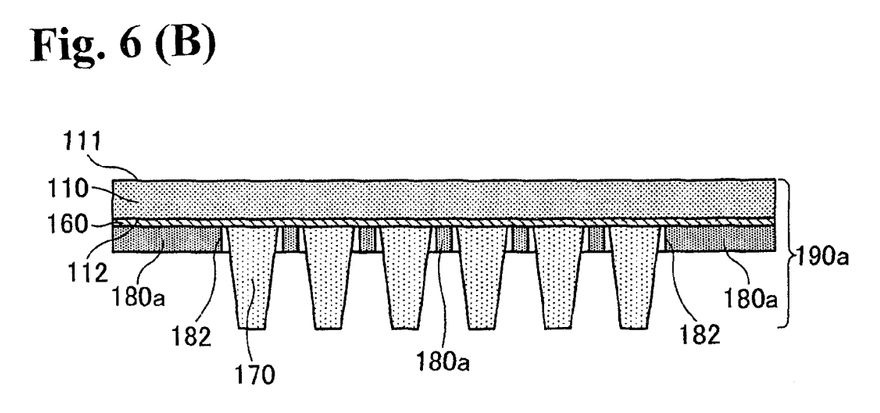

Next, a method of manufacturing the heat radiation member 190a will be described. FIGS. 6(A), 6(B) are diagrams illustrating the method of manufacturing the heat radiation member according to the modification of the first embodiment.

First, as illustrated in FIG. 6(A), the plurality of fins 170 is provided on the rear surface 112 of the substrate 110 with the bonding member 160 interposed therebetween. Here, the plurality of fins 170 is not completely bonded to the substrate 110. Then, the reinforcing member 180a is arranged so as to face the rear surface 112 of the substrate 110.

Then, as illustrated in FIG. 6(B), the reinforcing member 180a contacts the bonding member 160 such that the plurality of fins 170 is disposed in the plurality of through holes 182. In this case, the plurality of fins 170 is positioned by the plurality of through holes 182 of the reinforcing member 180a.

In this state, a heat treatment is performed such that the plurality of fins 170 and the reinforcing member 180a are bonded to the substrate 110 by the bonding member 160. In this way, the heat radiation member 190a is manufactured.

As such, according to the method of manufacturing the heat radiation member 190a, the reinforcing member 180a including the plurality of through holes 182 is arranged on the rear surface 112 of the substrate 110, with the bonding member 160 interposed therebetween, such that the plurality of fins 170 is disposed in the plurality of through holes 182 and then a heat treatment is performed to bond the plurality of fins 170 and the reinforcing member 180a to the substrate 110 using the bonding member 160.

According to this structure, since a process of arranging the reinforcing member 180a includes a process of positioning the plurality of fins 170, it is possible to reduce the number of manufacturing processes.

Second Embodiment

Figure 7:
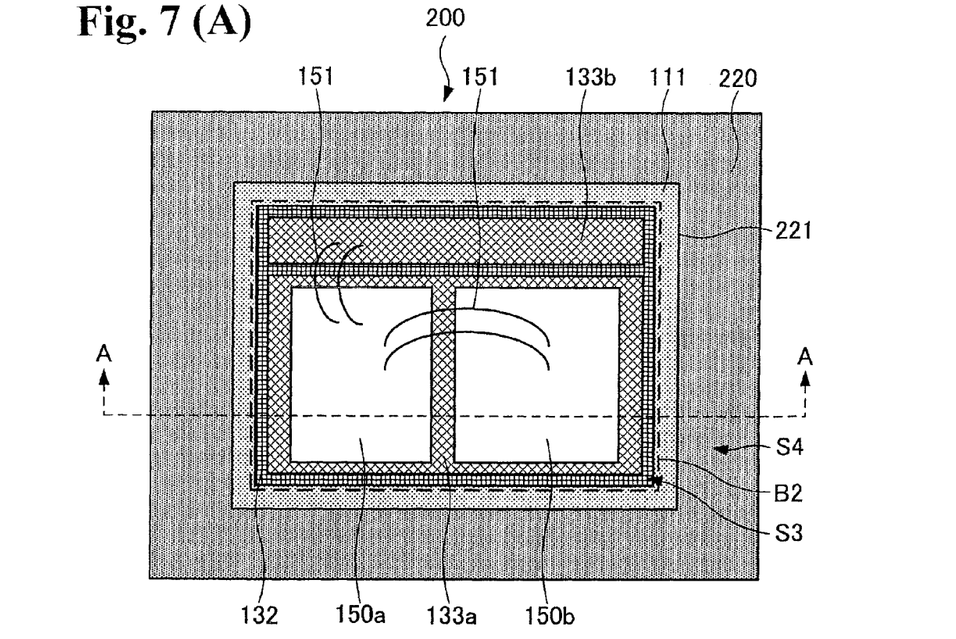
FIGS. 7A, 7B are diagrams illustrating an example of a semiconductor device according to a second embodiment.

Next, a semiconductor device according to a second embodiment will be described. FIGS. 7(A), 7(B) are diagrams illustrating an example of the semiconductor device according to the second embodiment. FIG. 7(A) is a plan view and FIG. 7(B) corresponds to a cross-sectional view taken along the dotted line A-A of FIG. 7(A).

A semiconductor device 200 according to the second embodiment differs from the semiconductor device 100 according to the first embodiment in that a reinforcing member is also formed on the front surface 111 of the substrate 110. The other structures are the same as those of the semiconductor device 100.

As illustrated in FIGS. 7(A) and 7(B), the front surface 111 of the substrate 110 includes an insulating substrate mounting region S3 which is surrounded by a dotted line B2 and on which an insulating substrate 130 is mounted and a peripheral region S4 which surrounds the insulating substrate mounting region S3. A reinforcing member 220 is formed on the peripheral region S4, with a bonding member 210 interposed therebetween. The reinforcing member 220 includes an opening 221. That is, the reinforcing member 220 has a frame shape. The reinforcing member 220 is formed on the peripheral region S4 such that the insulating substrate mounting region S3 is exposed through the opening 221.

The bonding member 210 is made of brazing filter metal, such as a copper alloy or an aluminum alloy. For example, a phosphorous copper-based material is used as the copper alloy. For example, an A4000 series aluminum alloy is used as the aluminum alloy.

The reinforcing member 220 is made of, for example, a copper alloy or an aluminum alloy. For example, a copper alloy (copper: 99.5% or more) obtained by adding a very small amount of cobalt, phosphorous, tin, nickel, or zinc to copper is used as the copper alloy. According to the JIS standard, for example, C1000 series to C7000 series copper alloys are used as the copper alloy. For example, an A3000 series aluminum alloy, an A5000 series aluminum alloy, an A6000 series aluminum alloy, or an A7000 aluminum alloy series is used as the aluminum alloy.

In this embodiment, the reinforcing member 220 is made of a different material from the substrate 110. Specifically, the reinforcing member 220 is made of a harder material than the substrate 110. The substrate 110 is made of a material with a higher thermal conductivity than that forming the reinforcing member 220.

In the semiconductor device 200, a portion including the substrate 110, the bonding members 160 and 210, a plurality of fins 170, and the reinforcing members 180 and 220 is referred to as a heat radiation member 230. Next, a method of manufacturing the semiconductor device 200 will be described. FIGS. 8(A), 8(B) are diagrams illustrating an example of the method of manufacturing the semiconductor device according to the second embodiment.

First, as illustrated in FIG. 8(A), the heat radiation member 230 is prepared. In a method of manufacturing the heat radiation member 230, first, the plurality of fins 170 and the reinforcing member 180 are mounted on the rear surface 112 of the substrate 110, with the bonding member 160 interposed therebetween, and the reinforcing member 220 is mounted on the front surface 111 of the substrate 110, with the bonding member 210 interposed therebetween.

In this state, a heat treatment is performed such that the plurality of fins 170 and the reinforcing member an 180 are bonded to the substrate 110 by the bonding member 160 and the reinforcing member 220 is bonded to the substrate 110 by the bonding member 210. That is, the plurality of fins 170 and the reinforcing members 180 and 220 are collectively bonded to the substrate 110. In this way, the heat radiation member 230 is manufactured. In addition, a portion of or the entire surface of the heat radiation member 230 may be plated with nickel.

Then, the bonding member 120, the insulating substrate 130, the bonding members 140a and 140b, and the semiconductor chips 150a and 150b are sequentially formed on the heat radiation member 230.

Then, as illustrated in FIG. 8(B), a heat treatment is performed on a structure 201 having each component provided therein. Then, the substrate 110 and the insulating substrate 130 are bonded to each other by the bonding member 120 and the insulating substrate 130 and the semiconductor chips 150a and 150b are bonded to each other by the bonding members 140a and 140b. In this way, the semiconductor device 200 is manufactured.

As described above, in the semiconductor device 200, the reinforcing member 180 is formed on the peripheral region S2 of the rear surface 112 of the substrate 110 with the bonding member 160 interposed therebetween. According to this structure, since the periphery of the substrate 110 is supported by the reinforcing member 180, it is possible to prevent the warping of the substrate 110. Therefore, it is possible to reduce the thickness of the substrate 110 and improve the radiation performance.

In the semiconductor device 200, the reinforcing member 220 is formed on the peripheral region S4 of the front surface 111 of the substrate 110 with the bonding member 210 interposed therebetween. According to this structure, since the periphery of the substrate 110 is supported by the reinforcing member 220, it is possible to effectively prevent the warping of the substrate 110. In addition, in the semiconductor device 200, the reinforcing member 180 may be removed.

(Modification)

Figure 9:
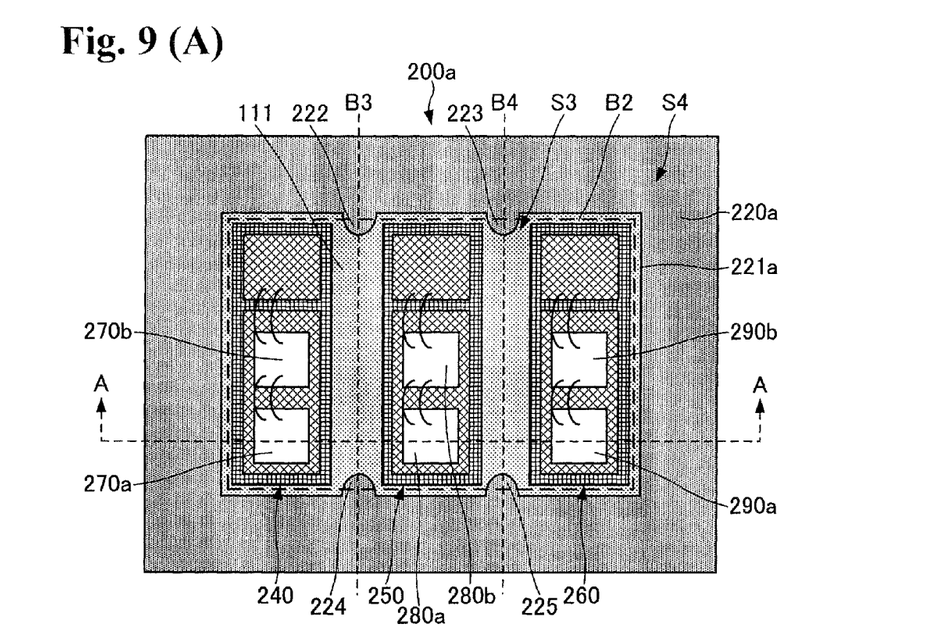
FIGS. 9A, 9B are diagrams illustrating a semiconductor device according to a modification of the second embodiment.

Next, a modification of the semiconductor device 200 will be described. FIGS. 9(A), 9(B) are diagrams illustrating a semiconductor device according to a modification of the second embodiment. FIG. 9(A) is a plan view illustrating the semiconductor device and FIG. 9(B) corresponds to a cross-sectional view taken along the dotted line A-A of FIG. 9(A).

A semiconductor device 200a according to the modification differs from the semiconductor device 200 in that, instead of the insulating substrate 130, a plurality of insulating substrates 240, 250, and 260 is provided on the substrate 110. In addition, the semiconductor device 200a differs from the semiconductor device 200 in that, instead of the reinforcing member 220, a reinforcing member 220a with a different shape from the reinforcing member 220 is used. The other structures are the same as those of the semiconductor device 200.

As illustrated in FIGS. 9(A) and 9(B), the insulating substrates 240 to 260 are provided on the front surface 111 of the substrate 110, with the bonding member 210 interposed therebetween. Each of the insulating substrates 240 to 260 has the same structure as the insulating substrate 130 of the semiconductor device 200.

Semiconductor chips 270a and 270b are provided on the insulating substrate 240, with a bonding member 271 interposed therebetween. Semiconductor chips 280a and 280b are provided on the insulating substrate 250, with a bonding member 272 interposed therebetween. Semiconductor chips 290a and 290b are provided on the insulating substrate 260, with a bonding member 273 interposed therebetween. For example, solder is used as the material forming the bonding members 271 to 273.

As illustrated in FIG. 9(A), the reinforcing member 220a includes an opening 221a and a plurality of protruding portions 222, 223, 224, and 225 which protrude toward the opening 221a. The reinforcing member 220a is formed on the peripheral region S4 such that the insulating substrate mounting region S3 is exposed through the opening 221a.

The insulating substrates 240 to 260 are arranged in the opening 221a, with the protruding portions 222 to 225 as boundaries. Here, for example, the insulating substrates 240 and 250 are arranged in the opening 221a, with a dotted line B3 connecting the protruding portion 222 and the protruding portion 224 as a boundary, and the insulating substrates 250 and 260 are arranged in the opening 221a, with a dotted line B4 connecting the protruding portion 223 and the protruding portion 225 as a boundary.

In the semiconductor device 200a, a portion including the substrate 110, the bonding members 160 and 210, a plurality of fins 170, and the reinforcing members 180 and 220a is referred to as a heat radiation member 230a.

In the semiconductor device 200a, the reinforcing member 220a is formed on the peripheral region S4 of the front surface 111 of the substrate 110, with the bonding member 210 interposed therebetween. According to this structure, since the periphery of the substrate 110 is supported by the reinforcing member 220a, it is possible to effectively prevent the warping of the substrate 110.

Figure 8:
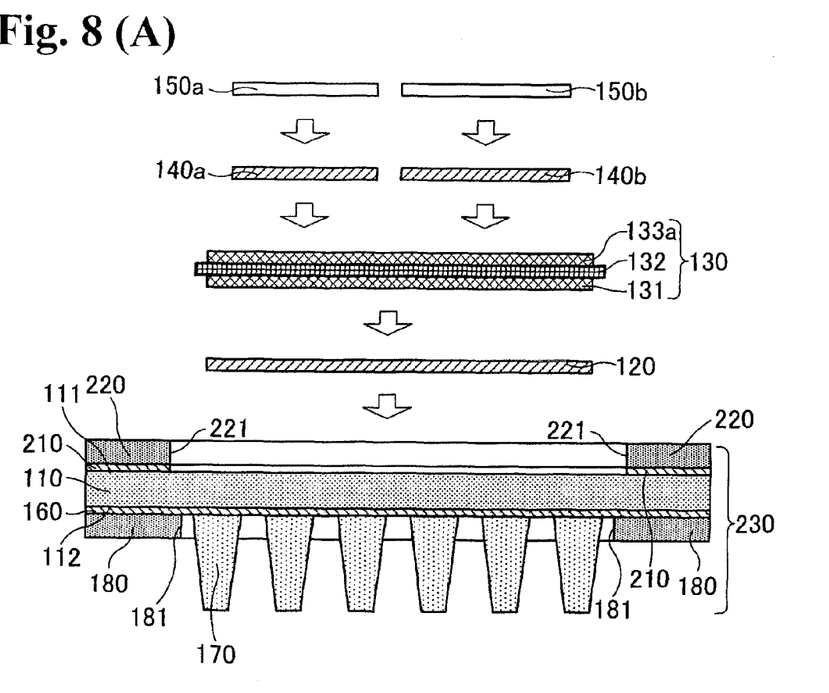
FIGS. 8A, 8B are diagrams illustrating an example of a method of manufacturing the semiconductor device according to the second embodiment.

A method of manufacturing the semiconductor device 200a is the same as the method of manufacturing the semiconductor device 200 illustrated in FIG. 8. That is, the semiconductor device 200a is manufactured by sequentially mounting the bonding member 120, the insulating substrates 240 to 260, the bonding members 271 to 273, and the semiconductor chips 270a, 270b, 280a, 280b, 290a, and 290b on the heat radiation member 230a and performing a heat treatment on a structure having each component provided therein.

In the method of manufacturing the semiconductor device 200a, when the insulating substrates 240 to 260 are mounted on the substrate 110 of the heat radiation member 230a, they are positioned using the protruding portions 222 to 225 provided in the reinforcing member 220a as marks.

For example, the insulating substrate 240 is positioned using the protruding portions 222 and 224 as marks. The insulating substrate 250 is positioned using the protruding portions 222 and 224 or the protruding portions 223 and 225 as marks. The insulating substrate 260 is positioned using the protruding portions 223 and 225 as marks.

As such, according to the method of manufacturing the semiconductor device 200a, the insulating substrates 240 to 260 are mounted on the substrate 110 using the protruding portions 222 to 225 provided in the reinforcing member 220a as marks. According to this structure, it is possible to position the insulating substrates 240 to 260, without using, for example, a jig. Therefore, it is possible to simplify a manufacturing process.

Third Embodiment

Figure 10:
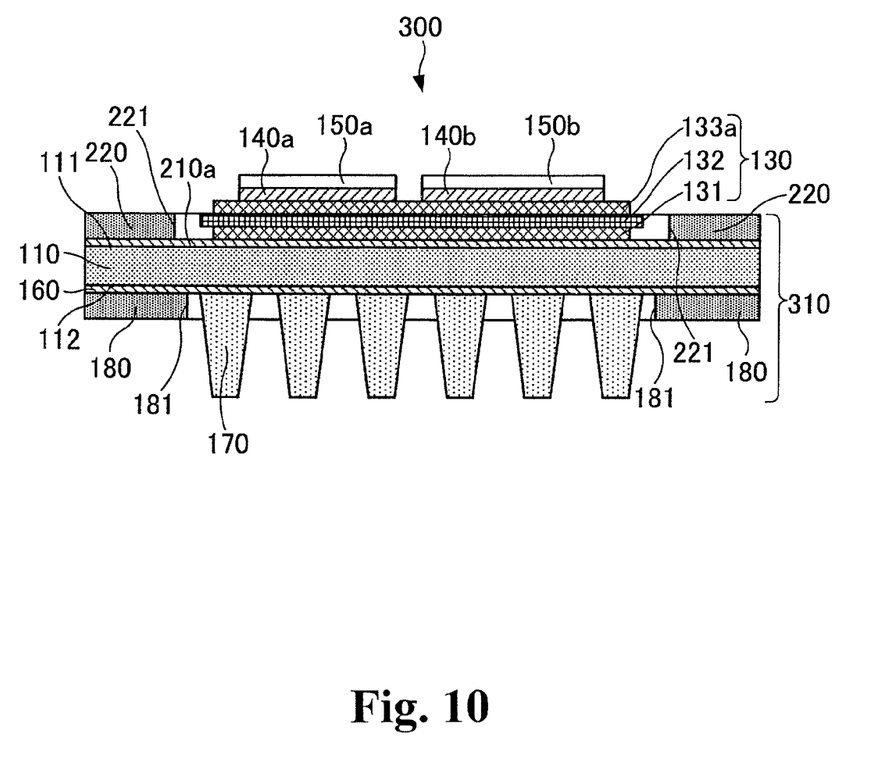
FIG. 10 is a cross-sectional view illustrating an example of a semiconductor device according to a third embodiment.

Next, a semiconductor device according to a third embodiment will be described. FIG. 10 is a cross-sectional view illustrating an example of the semiconductor device according to the third embodiment.

A semiconductor device 300 according to the third embodiment differs from the semiconductor device 200 according to the second embodiment in that, instead of the bonding members 120 and 210, a bonding member 210a is used to bond the insulating substrate 130 and the reinforcing member 220 to the substrate 110. The other structures are the same as those of the semiconductor device 200.

As illustrated in FIG. 10, the insulating substrate 130 and the reinforcing member 220 are mounted or formed on the front surface 111 of the substrate 110, with the bonding member 210a interposed therebetween. For example, the bonding member 210a is made of brazing filter metal, such as a copper alloy or an aluminum alloy. For example, a phosphorous copper-based material is used as the copper alloy. For example, an A4000 series aluminum alloy is used as the aluminum alloy.

Figure 11:
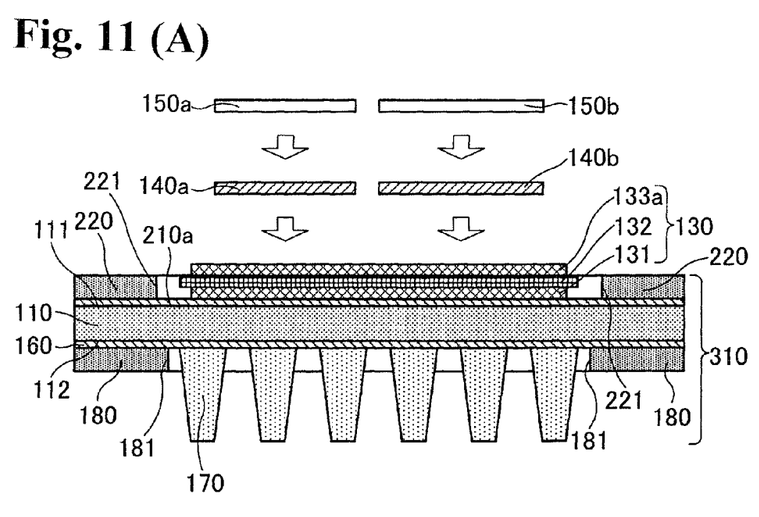
FIGS. 11A, 11B are diagrams illustrating an example of a method of manufacturing the semiconductor device according to the third embodiment.

In the semiconductor device 300, a portion including the substrate 110, the bonding members 160 and 210a, a plurality of fins 170, and the reinforcing members 180 and 220 is referred to as a heat radiation member 310. Next, a method of manufacturing the semiconductor device 300 will be described. FIGS. 11(A), 11(B) are diagrams illustrating an example of the method of manufacturing the semiconductor device according to the third embodiment.

First, as illustrated in FIG. 11(A), a laminate of the insulating substrate 130 and the heat radiation member 310 is prepared. In a method of manufacturing the laminate, first, the plurality of fins 170 and the reinforcing member 180 are mounted on the rear surface 112 of the substrate 110, with the bonding member 160 interposed therebetween, and the insulating substrate 130 and the reinforcing member 220 are mounted on the front surface 111 of the substrate 110, with the bonding member 210a interposed therebetween.

Then, in this state, a heat treatment is performed such that the plurality of fins 170 and the reinforcing member 180 are bonded to the substrate 110 by the bonding member 160 and the insulating substrate 130 and the reinforcing member 220 are bonded to the substrate 110 by the bonding member 210a. That is, the plurality of fins 170, the reinforcing members 180 and 220, and the insulating substrate 130 are collectively bonded to the substrate 110. In this way, the laminate of the insulating substrate 130 and the heat radiation member 310 is manufactured.

Then, bonding members 140a and 140b and semiconductors chip 150a and 150b are sequentially mounted on the laminate. Then, as illustrated in FIG. 11(B), a heat treatment is performed on a structure 301 having each component provided therein. Then, the semiconductor chips 150a and 150b are bonded to the insulating substrate 130 by the bonding members 140a and 140b. In this way, the semiconductor device 300 is manufactured.

As described above, in the semiconductor device 300, the reinforcing member 180 is formed on a peripheral region S2 of the rear surface 112 of the substrate 110, with the bonding member 160 interposed therebetween. According to this structure, since the periphery of the substrate 110 is supported by the reinforcing member 180, it is possible to prevent the warping of the substrate 110. Therefore, it is possible to reduce the thickness of the substrate 110 and improve the radiation performance.

In the semiconductor device 300, the reinforcing member 220 is formed on a peripheral region S4 of the front surface 111 of the substrate 110, with the bonding member 210a interposed therebetween. According to this structure, since the periphery of the substrate 110 is supported by the reinforcing member 220, it is possible to effectively prevent the warping of the substrate 110.

The principle of the invention has been just described above. Various modifications and changes of the invention can be made by those skilled in the art. The invention is not limited to the above-mentioned accurate structures and applications, but all of the corresponding modifications and equivalents are considered to be within the scope of the appended claims and equivalents thereof in the invention.

EXPLANATIONS OF LETTERS OR NUMERALS 100, 100a, 200, 200a, 300 SEMICONDUCTOR DEVICE
101, 201, 301 STRUCTURE
110 SUBSTRATE
111 FRONT SURFACE
112 REAR SURFACE
120, 140a, 140b, 160, 210, 210a, 271, 272, 273 BONDING MEMBER
130, 240, 250, 260 INSULATING SUBSTRATE
131, 133a, 133b CONDUCTOR LAYER
132 INSULATING LAYER
150a, 150b, 270a, 270b, 280a, 280b, 290a, 290b SEMICONDUCTOR CHIP

151 WIRE
170 FIN
180, 180a, 220, 220a REINFORCING MEMBER
181, 221, 221A OPENING
182 THROUGH HOLE
190, 190a, 230, 230a, 310 HEAT RADIATION MEMBER
222, 223, 224, 225 PROTRUDING PORTION
S1 FIN FORMING REGION
S2, S4 PERIPHERAL REGION
S3 INSULATING SUBSTRATE MOUNTING REGION

What is claimed is:

1. A semiconductor device comprising:
a substrate having a front surface, and a rear surface including a fin forming region and a first peripheral region surrounding the fin forming region;
an insulating substrate disposed on the front surface;
a semiconductor chip disposed on the insulating substrate;
a first bonding member bonded to the rear surface of the substrate;
a plurality of fins formed in the fin forming region and bonded to the rear surface of the substrate through only the first bonding member; and
a first reinforcing member formed on the rear surface of the substrate separately from the plurality of fins and bonded to the rear surface of the substrate through only the first bonding member separately from the plurality of fins, so as to overlap the first peripheral region.

2. The semiconductor device according to claim 1, wherein the first reinforcing member is made of a different material than that of the substrate.

3. The semiconductor device according to claim 2, wherein the first reinforcing member is made of a harder material than that of the substrate.

4. The semiconductor device according to claim 2, wherein the substrate is made of a material with a higher thermal conductivity than that of forming the first reinforcing member.

5. The semiconductor device according to claim 1, wherein the first reinforcing member is formed in the first peripheral region through only the bonding member.

6. The semiconductor device according to claim 5, wherein the first reinforcing member comprises an opening, and
the first reinforcing member is formed in the first peripheral region to expose the fin forming region through the opening.

7. The semiconductor device according to claim 5, wherein the front surface of the substrate comprises an insulating substrate mounting region and a second peripheral region surrounding the insulating substrate mounting region,
the insulating substrate is mounted in the insulating substrate mounting region, and
a second reinforcing member is formed in the second peripheral region of the front surface through a second bonding member.

8. The semiconductor device according to claim 7, wherein the insulating substrate is mounted in the insulating substrate mounting region through a third bonding member which is made of a material same as that of the second bonding member in the second peripheral region of the front surface.

9. The semiconductor device according to claim 7, wherein the plurality of insulating substrates is provided on the front surface of the substrate,
the second reinforcing member on the front surface includes an opening and protruding portions protruding toward the opening, and
each of the plurality of insulating substrates is arranged in the opening, with the protruding portion as a boundary.

10. The semiconductor device according to claim 7, wherein the plurality of fins is arranged under the insulating substrate and the semiconductor chip, the first reinforcing member is arranged to surround the plurality of fins, and the second reinforcing member is arranged above the first reinforcing member through the substrate.

11. The semiconductor device according to claim 1, wherein the first reinforcing member comprises a plurality of through-holes,
the first reinforcing member is formed in the first peripheral region and the fin forming region to dispose each of the plurality of fins in each of the plurality of through holes.

12. The semiconductor device according to claim 1, wherein the front surface of the substrate includes an insulating substrate mounting region and a second peripheral region surrounding the insulating substrate mounting region,
the insulating substrate is mounted in the insulating substrate mounting region, and
a second reinforcing member is formed in the second peripheral region of the front surface through a second bonding member.

13. The semiconductor device according to claim 1, wherein the plurality of fins is arranged apart from each other to form a space therebetween, and the bonding member is exposed in the space.

14. A heat radiation member, comprising:
a substrate having a front surface including an insulating substrate mounting region, and a rear surface including a fin forming region and a first peripheral region surrounding the fin forming region;
a first bonding member bonded to the rear surface of the substrate;
a plurality of fins formed in the fin forming region and bonded to the rear surface of the substrate through only a bonding member; and
a first reinforcing member formed on the rear surface of the substrate separately from the plurality of fins and bonded to the rear surface of the substrate through only the first bonding member separately from the plurality of fins, so as to overlap the first peripheral region.

15. The heat radiation member according to claim 14, wherein the first reinforcing member is made of a different material than that of the substrate.

16. The heat radiation member according to claim 15, wherein the first reinforcing member is made of a harder material than that of the substrate.

17. The heat radiation member according to claim 15, wherein the substrate is made of a material with a higher thermal conductivity than that of the first reinforcing member.

18. The heat radiation member according to claim 14, wherein the first reinforcing member is formed in the first peripheral region through the first bonding member.

19. The heat radiation member according to claim 14, wherein the front surface of the substrate comprises a second peripheral region surrounding the insulating substrate mounting region, and
a second reinforcing member is formed in the second peripheral region of the front surface through a second bonding member.

20. A semiconductor device comprising:
a substrate having a front surface and a rear surface formed at a side opposite to the front surface, the rear surface including a fin forming region and a peripheral region surrounding the fin forming region;
an insulating substrate disposed on the front surface;
a semiconductor chip disposed on the insulating substrate;

a bonding member bonded to the rear surface of the substrate;
a plurality of fins formed in the fin forming region and bonded to the rear surface of the substrate through the bonding member;
a reinforcing member formed on the rear surface of the substrate and bonded to the rear surface of the substrate through the bonding member to overlap the peripheral region.

* * * * *